United States Patent [19]
Watt

[11] Patent Number: 5,477,413
[45] Date of Patent: Dec. 19, 1995

[54] ESD PROTECTION STRUCTURE FOR P-WELL TECHNOLOGY

[75] Inventor: Jeffrey T. Watt, Mountain View, Calif.

[73] Assignee: Cypress Semiconductor Corp., San Jose, Calif.

[21] Appl. No.: 187,746

[22] Filed: Jan. 26, 1994

[51] Int. Cl.$^6$ .................................................. H02H 9/04
[52] U.S. Cl. ............................... 361/56; 361/91; 361/118; 361/127
[58] Field of Search ................................. 361/56, 58, 91, 361/111, 118, 119, 127

[56] References Cited

U.S. PATENT DOCUMENTS

| | | | |
|---|---|---|---|
| 4,896,243 | 1/1990 | Chatterjee et al. | 361/91 |
| 4,990,802 | 2/1991 | Smooha | 307/482 |
| 5,021,853 | 6/1991 | Mistry | 357/23.13 |
| 5,028,819 | 7/1991 | Wei et al. | 307/451 |
| 5,051,860 | 9/1991 | Lee et al. | 361/58 |
| 5,060,037 | 10/1991 | Rountree | 35/23.13 |
| 5,157,573 | 10/1992 | Lee et al. | 361/56 |

OTHER PUBLICATIONS

"Achieving Uniform nMOS Device Power Distribution for Sub-Micron ESD Reliability", C. Duvvury, C. Diaz and T. Haddock, 1992 IEEE IEDM Proceedings, pp. 131–134.

"Improving the ESD Failure Threshold of Silicided nMOS Output Transistors by Ensuring Uniform Current Flow", T. Polygreen and A. Chatterjee, 1989 EOS/ESD Symposium Proceedings, pp. 167–174.

Primary Examiner—A. D. Pellinen
Assistant Examiner—S. Jackson
Attorney, Agent, or Firm—Blakely, Sokoloff, Taylor & Zafman

[57] ABSTRACT

An ESD protection structure for p-well technology using nMOS FETs that prevents the lock-on condition normally occurring after one FET of a multi finger structure snaps back. The multifinger structure is contained in a main p-well and channels ESDs of a first polarity from the contact pad to a metal conduit. A resistance is provided between the main p-well and the conduit. Further, the circuit channeling ESDs of a polarity opposite to the first polarity is contained in a second p-well that is distinct from the main p-well. An ESD event causes one of the fingers to snap back. Resulting drain current through that finger generates electron hole pairs in the main p-well by impact ionization. Thus generated holes, traveling to the conduit through the resistance, raise the voltage of the main p-well, and therefore shift the i-v characteristic curves of all the FETs to a point where they no longer exhibit a knee. The absence of a knee prevents the remaining fingers from being locked off by the finger that snapped back. Consequently, all FETs are turned on and ESD protection is provided by all FETs in the main p-well.

19 Claims, 6 Drawing Sheets

ESD PROTECTION STRUCTURE FOR P-WELL TECHNOLOGY

BACKGROUND OF THE INVENTION

1. Field of the Invention

The invention relates to ElectroStatic Discharge (ESD) protection for integrated circuits using p-well technology.

2. Prior Art

Integrated circuits are particularly susceptible to ElectroStatic Discharges (ESDs). ESDs are generated by human contact, or when handling or bonding a circuit, or merely when the part is sliding around.

The time profiles of typical ESDs (or zaps) have been studied and can be found in the literature. (C. Duvvury, C. Diaz, and T. Haddock, "Achieving Uniform nMOS Device Power Distribution For Sub-micron ESD Reliability", 1992 IEEE IEDM Proceedings, pp. 131–134).

ESDs find their way into a circuit through the metal pins which are connected to the pads through bond wires. Naturally, therefore, ways of neutralizing the harmful effects of ESDs are centered around all the contact pads of integrated circuits.

The ways of protecting an integrated circuit from ESDs depend on the function of the pin, e.g., depending on whether the pin is for input, output, or input/output (I/O) or power supply. For example, in the Duvvury reference above, a circuit is provided near the pad that works for input pins that must present high input impedance. The same circuit will not work for output or I/O pins.

ESD protection circuits are presently implemented near each pad. In a prevalent general design shown in FIG. 1, an ESD protection circuit 12 is interposed between the pad 10 and the $V_{SS}$ metal conduit 19. The pad is also connected to a local ESD protection circuit 13 which may further include an input buffer which is further serially connected to circuit 14. It will be appreciated that the local ESD circuit is separate from the input buffer. The metal conduit 19 can be any one of the ground, or the power supply, or the $V_{SS}$ conduits. The $V_{SS}$ conduit is usually maintained at 0 V. The function of the ESD protection circuit is to channel the charge of the ESD to the metal conduit, while not shorting out the pad 10 to the conduit 19 during regular integrated circuit operation.

In an embodiment such as the one shown in FIG. 1, the ESD protection circuit 12 comprises typically two components, one to protect against positive ESD events and one to protect against negative ESD events. In some ESD circuits, the same component protects against both negative and positive ESD events.

A generic ESD protection circuit (as shown in FIG. 1) that does not depend on whether the function of the pin is input, output or I/O would be desirable, as it would help in standardization of ESD protection circuits. The scheme of FIG. 1 is not intended to be limiting, as positive and negative ESD discharges could be channeled into voltage conduits other than that of $V_{SS}$.

The generic ESD protection circuit of FIG. 1 has been utilized in the prior art. As seen in FIG. 2A, an ESD protection circuit 22 is interposed between the pad 20 and the $V_{SS}$ conduit 29. The ESD protection circuit 22 comprises negative and positive ESD protection circuits, and is disposed within a single p-well, in the n-type semiconductor substrate.

Protection against negative ESDs is accomplished by diode 24. During a negative ESD event, the diode 24 becomes forward biased, shorting the $V_{SS}$ bus to the pad. Additionally, in nMOS technology, the signals of interest are positive with respect to electrical ground. Therefore, regular input, output, and I/O signals are not affected by the diode 24.

Protection against positive ESDs is typically accomplished by grounded gate nMOS Field Effect Transistors (FETs) 25, 26, etc., arranged in parallel. While ordinary positive signals sense a high impedance between the pad 20 and the metal conduit 29, very strong signals such as those of a positive ESD event turn on FETs 25, 26, etc., and the ESD charge is therefore channeled to the metal conduit 29, instead of being channeled to the vulnerable circuit.

Accordingly, a design question is usually how many of the (usually similar) nMOS FETs or "fingers" should be disposed in parallel for the ESD protection circuit to be effective. This is a function of the rated ESD capacity of the circuit, and the material and design parameters.

However, this design approach depends on all parallel nMOS FETs working together. There is a problem that prevents them from working all together, which will be understood in terms of the following description of the invention.

General solutions have been proposed in the prior art. (See, for example, "Improving The ESD Failure Threshold Of Silicided nMOS Output Transistors By Ensuring Uniform Current Flow", T. Polgreen and A. Chatterjee, 1989 EOS/ESD Symposium Proceedings, pp. 167–174. Also, see "Achieving Uniform nMos Device Power Distribution for Submicron ESD Reliability," C. Duvvury, C. Diaz, and T. Haddock, 1992 IEEE IEDM Proceedings, pp. 131–134.) However these solutions tend to require that all parallel nMOS FETs work together, which they fail to do in the case of an ESD discharge, and in the case of the ESD circuit described in the 1992 IEEE IEDM Proceedings, this circuit can only be used for inputs (and not outputs or Input/Outputs) and this circuit requires careful design of the thick gate oxide and thin gate oxide transistors.

It would be desirable to have ESD protection structures that can be used in connection with both input and output pins. Current ESD protection structures which are multifinger arrangements of grounded gate nMOS FETs face the problem of lock-on due to snapback with subsequent burnout. Accordingly, it would be desirable to have positive ESD protection structures comprising multifinger arrangements of grounded gate nMOS FETs that all turn on simultaneously, while the burnout problem is avoided. Even though the lock-on problem usually only occurs in fabrication processes that use salicide, such processes are relatively common and thus a solution to the problem is desirable.

SUMMARY OF THE INVENTION

It is an object of the present invention to provide an improved apparatus for protection from ESD of pads of input, output and I/O pins of integrated circuits using p-well technology.

It is a further object of the present invention to provide an improved apparatus for ESD protection for integrated circuits using p-well technology with salicided diffusion.

It is yet another object of the present invention to provide an improved apparatus for ESD protection by preventing the failure of individual fingers resulting from the lock-on condition associated with multi-finger grounded gate nMOS FET ESD protection circuits.

In an embodiment of the present invention, the negative ESD protection circuit comprises a diode that is in a separate p-well from the p-well that contains the positive ESD protection circuit. The positive ESD protection circuit comprises a multi-finger grounded-gate nMOS FET circuit. A resistance is electrically connected between the p-well that contains the positive ESD protection circuit and the $V_{SS}$ conduit that is to absorb the ESD. The resistance channels a fraction of the current associated with a positive ESD event, and therefore raises the potential of the p-well with respect to the potential of the $V_{SS}$ conduit, which has been set at zero. As a result, the i-v characteristic curves of the nMOS fingers shift to where they exhibit no "knee," and individual finger snapback, lock-on, and burnout is prevented.

Therefore, the apparatus of the present invention provides ESD protection to integrated circuits with p-well technology for input, output, and I/O pins.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention unnecessarily.

Figure 1:
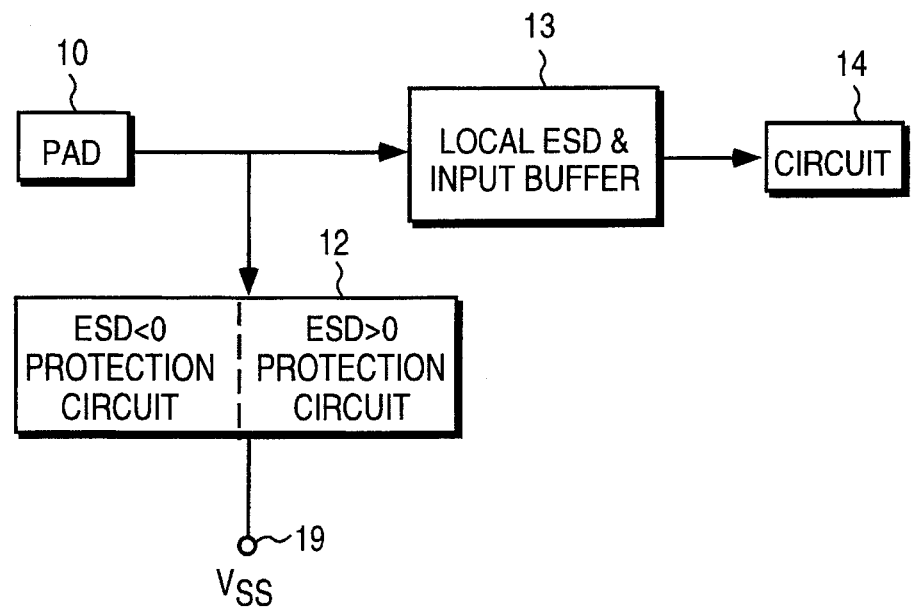
FIG. 1 shows the main components of a typical ESD protection circuit.
Figure 2A:
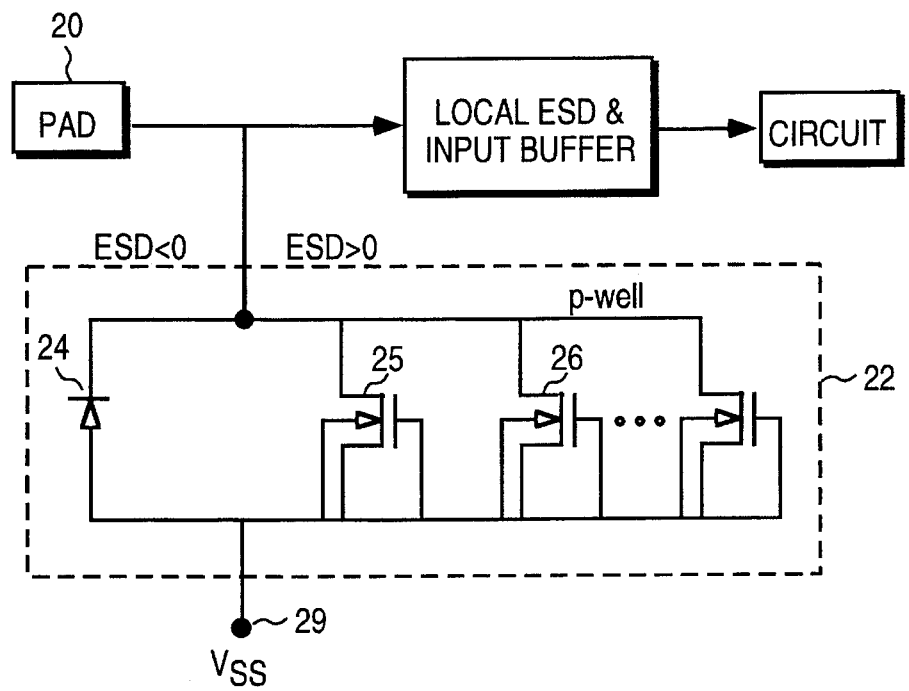
FIG. 2A shows a prior art multi-finger implementation of an nMOS ESD protective structure.

Ordinarily, the voltage of the single p-well containing the ESD protection circuit 22 of FIG. 2A is about 0.0 V which is usually $V_{SS}$. During normal operation, the n-type substrate is usually at $V_{CC}$ (or $V_{DD}$) but during an ESD, it is also at 0.0 V.

Figure 2B:
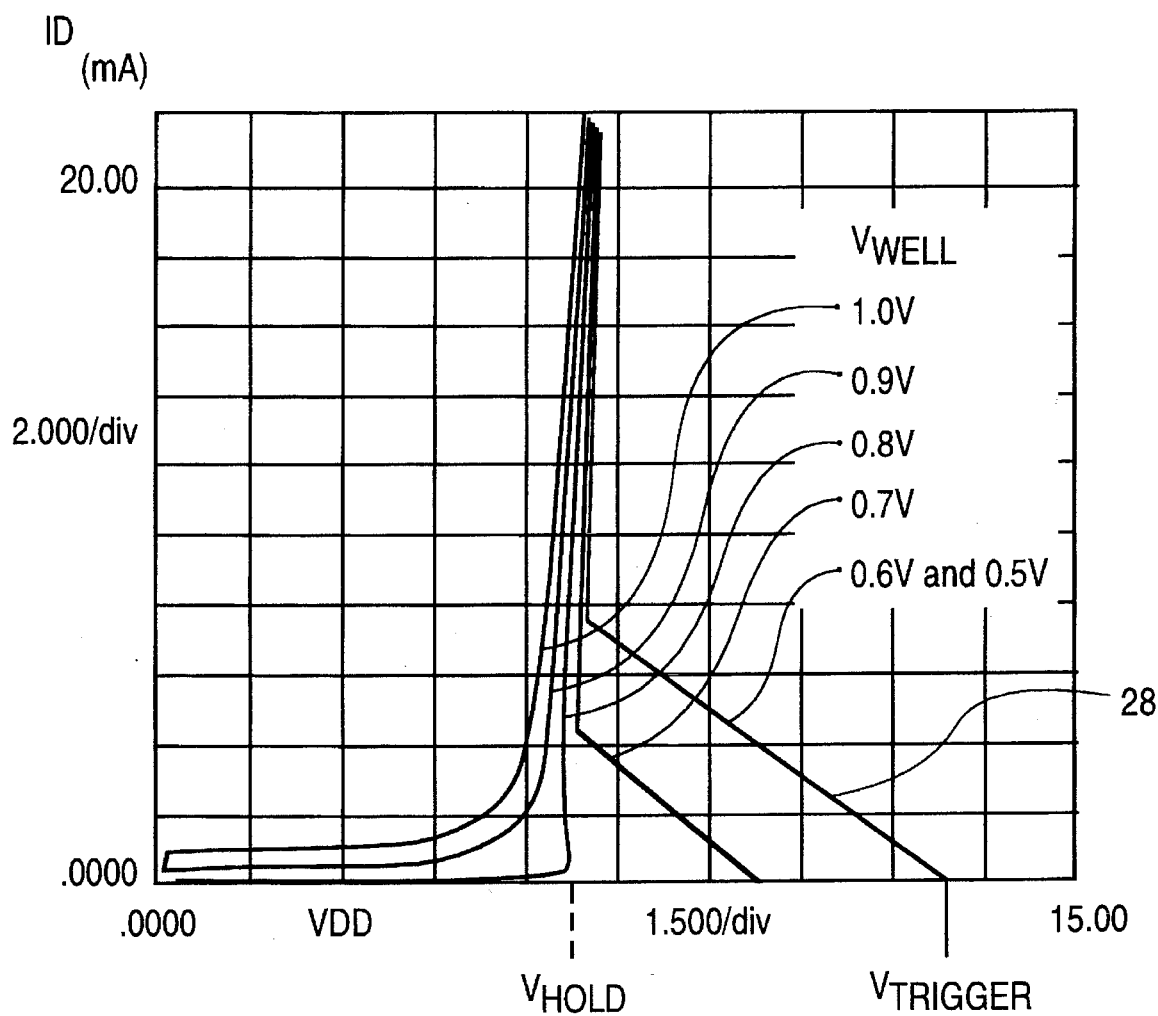
FIG. 2B shows the i-v characteristic curves for nMOS FETs at various well voltages.

FIG. 2B shows a family of FET i-v curves. Each i-v curve is the i-v curve of an FET, for different well voltage. The horizontal axis displays the voltage difference between the drain and the source, while the vertical axis displays the allowed drain current.

I-V curves are shown for FETs with well voltages of 0.6, 0.7, 0.8, 0.9 and 1.0 V. It can be noted that the i-v curve for a well voltage of 0.6 V coincides with the i-v curve for any well voltage between 0.0 V and 0.6 V. All of these curves have been generated in a semiconductor parameter analyzer, and are approximations of the real behavior of the FETs. Indeed, FIG. 2B was generated with a resistor in series with the actual nMOS FETs to prevent their burnout.

Of interest about the i-v curves of FIG. 2B is the "knee" exhibited by curves with well voltages of up to about 0.8 V, which results in "trigger voltage" and "hold voltage" features. FIG. 2B suggests that the trigger voltage is a function of well voltage for grounded gate FETs. Trigger voltage $V_{TRIGGER}$ is the value of the applied voltage that will force the FET to turn on; it is the voltage coordinate of the rightmost part of the knee. The hold voltage $V_{HOLD}$ is the voltage coordinate of the nearly vertical line of the i-v characteristic. A knee exists in the i-v characteristic curve for as long as $V_{TRIGGER}$ is larger than $V_{HOLD}$. Of interest is i-v curve 28, which is the characteristic i-v curve under normal conditions.

As voltage is applied across an FET and increased from a zero value, the value of the resulting current rises very slowly. This fact is somewhat obscured in FIG. 2B by the fact that the horizontal portion of curve 28 of FIG. 2B is shown as exactly horizontal.

As the voltage increases, it reaches $V_{TRIGGER}$, which corresponds to the knee of the curve 28, and then the device "snaps back", in that it turns on and allows more current through, while the input voltage can be as low as $V_{HOLD}$.

If the originally applied voltage is that of a positive ESD event, and the ESD voltage momentarily exceeds $V_{TRIGGER}$, then, as the FET device allows more current through it, the ESD voltage at the input will decrease and be clamped at $V_{HOLD}$, while the ESD event lasts. The device is then said to be in snapback mode.

Figure 2C:
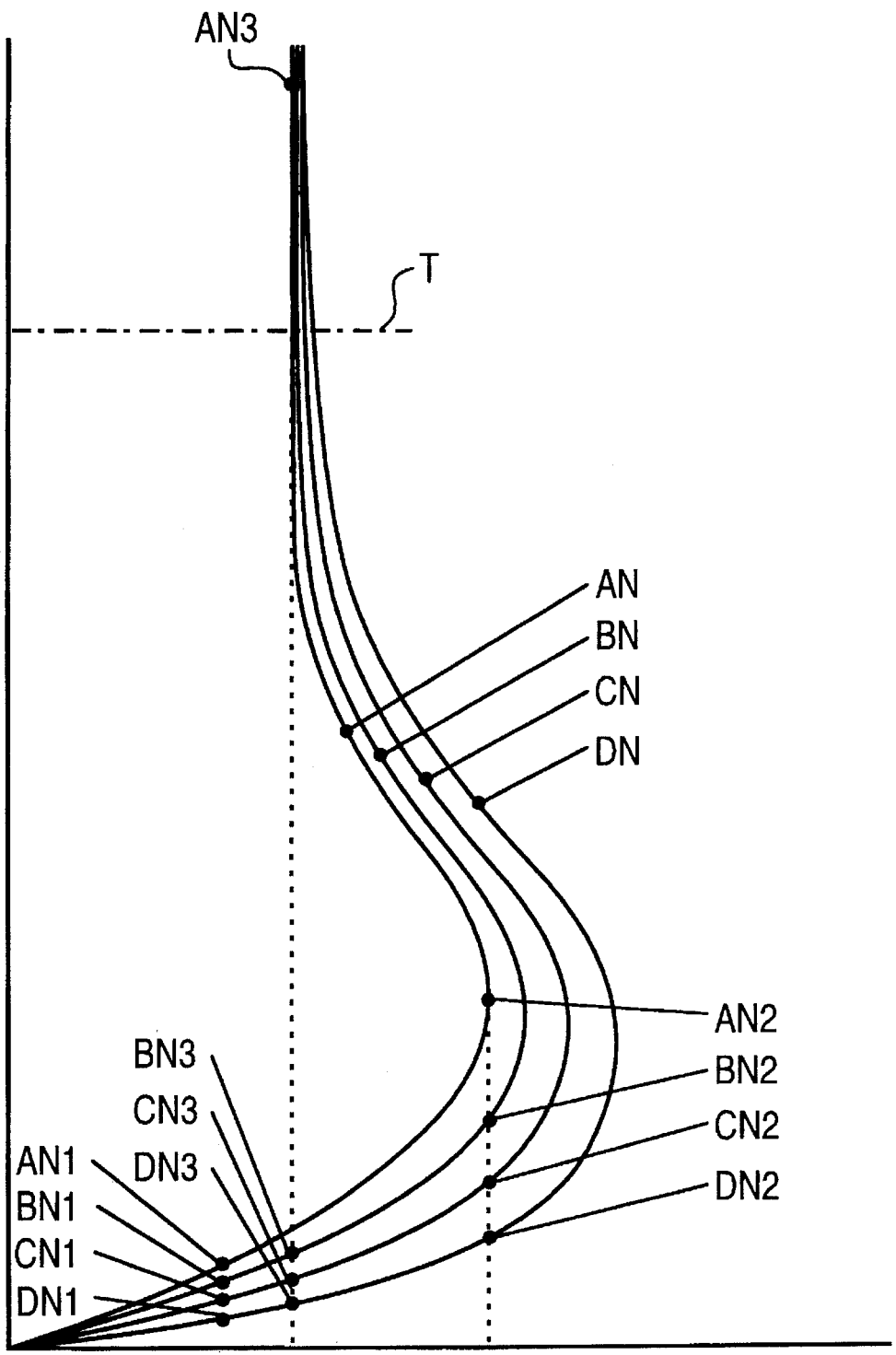
FIG. 2C illustrates the prior art problem of snapback, lock-on, and burnout of only one of the nMOS fingers during a positive ESD event.

The i-v curve 28 of FIG. 2B corresponds to each and every one of the many grounded gate nMOS FETs of FIG. 2A that are in parallel. However, manufacturing discrepancies cause the FETs to each have i-v curves that are slightly different from each other, although clustered around the central i-v curve 28 of FIG. 2B. Such a cluster is shown in FIG. 2C (which is not to scale) for a hypothetical 4-finger structure, comprising FETs A, B, C and D. The four nMOS FETs normally have four corresponding i-v curves AN, BN, CN, and DN, that are slightly separated, even though all are at a common well voltage of about 0.0 V. The separation is owing to manufacturing discrepancies typically in their width and length or oxide thickness or doping profiles. FIG. 2C is not drawn to scale, but is drawn to better illustrate how the usual manufacturing discrepancies cause the snapback, lock-on, and individual finger burnout phenomenon described below.

For purposes of this illustration, FET "A" has been selected to have the smallest trigger value under normal conditions, or "weakest knee". When the hypothetical 4-finger structure initially receives a positive ESD of rising voltage, the FETs will each be at some point in time at points AN1, BN1, CN1, and DN1, shown in FIG. 2C. This means that each finger will be allowing, at this time, very little current through it, as measured on the vertical axis. As the ESD applied voltage rises to the trigger value of the finger with the smallest individual trigger value (here A), the FETs will be at operating points AN2, BN2, CN2 and DN2 of FIG. 2C. It is at this point that the finger with the smallest individual trigger value snaps back, that is, accepts more current. As the ESD charge is channeled through, the voltage drops to and is clamped at the holding voltage of the individual nMOS finger with the smallest individual trigger value. The FETs will be at the operating points AN3, BN3, CN3 and DN3 that are characterized by a common voltage value. This condition can be characterized as the lock-on condition due to snapback. From the relative values of AN3, BN3, CN3 and DN3, it can be seen that FET A practically carries all the ESD current because it has been "locked" in the ON state, while FETs B, C, D have been locked in the OFF state. This results in FET A carrying the current that was originally designed for all four FETs simultaneously. As the ESD event continues, the current through FET A rises uncontrollably past some current threshold value T which causes FET A to burn out. Typically, when the first FET in the ESD protection circuit "burns out," it causes leakage which makes the part nonfunctional.

Figure 3:
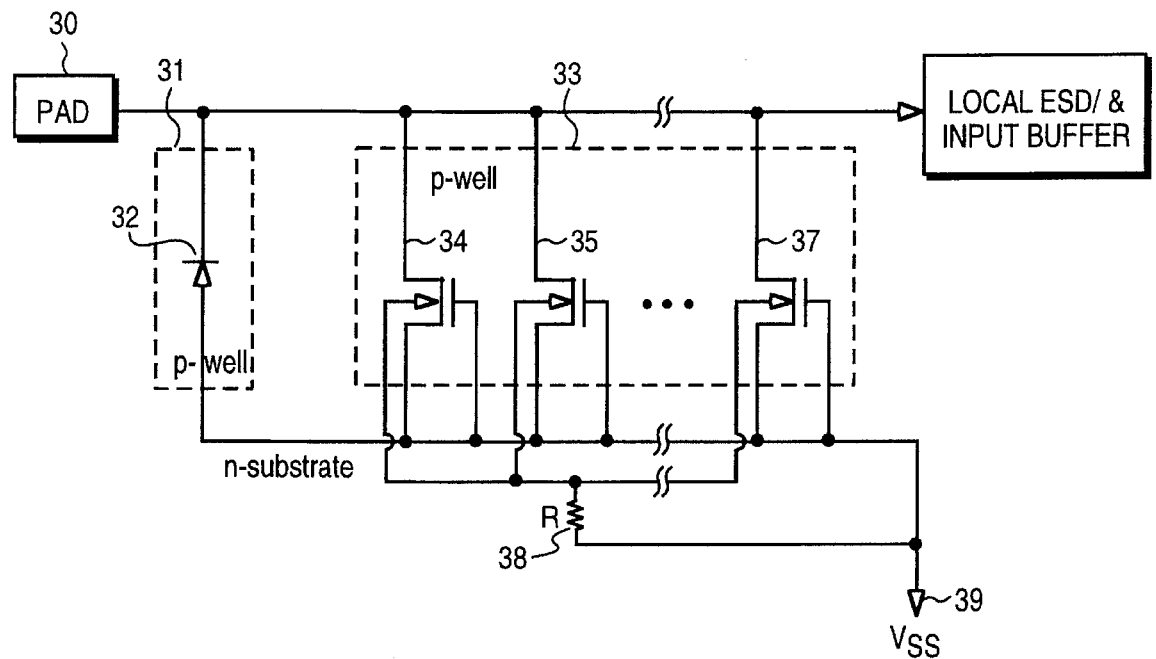
FIG. 3 illustrates a schematic diagram according to the present invention.

An embodiment of the present invention described in FIG. 3, operates to absorb ESDs appearing at pad 30, designed as an input to the IC containing the pad 30, and channel them to a metal conduit $V_{SS}$ 39, that is typically set at a potential value of zero (or some other reference value).

According to the embodiment of FIG. 3, an apparatus is provided for an ESD protection circuit that comprises a positive ESD protection circuit and a negative ESD protection circuit, each disposed in separate p-wells shown in FIG. 3.

The positive and negative ESD protection circuits each have two terminals. Terminals in this context can also mean nodes, points where one circuit or circuit component ends and another circuit or circuit component begins.

The positive ESD protection circuit is disposed in p-well 33 and comprises a plurality of grounded gate nMOS FETs 34, 35, . . . , 37 arranged in a multifinger configuration. Any number of two or more nMOS FETs may be used in the p-well 33 even though only three are shown in FIG. 3. According to an embodiment of the present invention, electrical resistance 38 is further provided electrically connecting the p-well that contains the positive ESD protection circuit 33 and the metal conduit $V_{SS}$ 39 that is to absorb the ESD.

The negative ESD protection circuit is disposed in a p-well 31 that is separate from p-well 33, and comprises preferably a diode 32 electrically connected between the pad 30 and the typically metal conduit $V_{SS}$ 39 that absorbs the ESD.

In the embodiment of the present invention shown in FIG. 3, negative ESDs appearing at the pad 30 are absorbed through diode 32 into conduit $V_{SS}$ 39 (typically through metal layers on the IC and then to the $V_{SS}$ pin). Positive ESDs appearing at pad 30 are absorbed by the positive ESD protection circuit, which exhibits the snapback but prevents the burnout due to lock-on characteristic that was a problem in the prior art.

Figure 4:
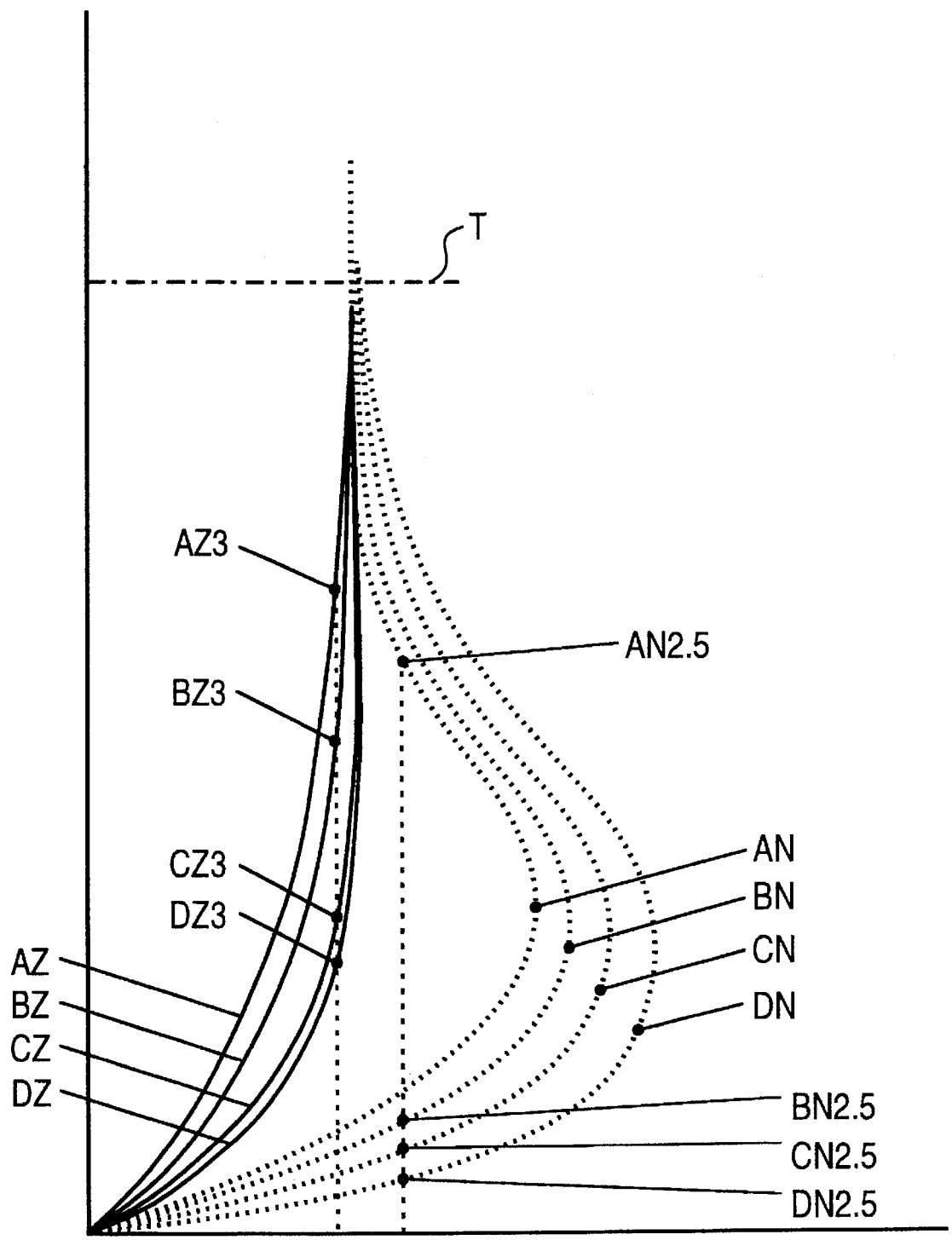
FIG. 4 illustrates the avoidance of lock-on during a positive ESD event, resulting from an implementation of the present invention.

This inventive aspect of the presented apparatus can be explained in terms of the family of i-v curves of FIG. 2B, the snapback and lock-on described in terms of FIG. 2C, and in terms of FIG. 4.

According to FIG. 2B, since the nMOS FETs of the present invention are substantially similar, and their p-well is normally at a voltage of about 0.0 V, they all exhibit approximately the i-v characteristic shown by curve 28. The i-v curves of a hypothetical 4-finger (A, B, C, and D) structure according to the present invention exhibit discrepancies; although the i-v curves would practically coincide with line 28 of FIG. 2B, the discrepancies are greatly exaggerated in FIG. 2C, and are normally disposed to snapback and lock-on. Specifically, FET A (the FET with the weakest knee) is disposed to snapping back at point AN2 and eventually locking on (i.e. conducting current) at point AN3, while the other FETs would be locked off (not conduct current between their source and drain) at points BN3, CN3 and DN3.

The embodiment of the present invention does not prevent snap back of the FET with the weakest knee in its individual i-v curve. As seen in FIG. 4, according to the present invention, a positive ESD event, at some time after snap back (defined by AN2, BN2, CN2, DN2, points not shown in FIG. 4 but in FIG. 2C) and before lock-on (defined by AN3, BN3, CN3, DN3, points not shown in FIG. 4, but shown in FIG. 2C), the operating points of the 4 FETs of the hypothetical 4 finger structure are at points AN2.5, BN2.5, CN2.5 and DN2.5 (of FIG. 4) of operating curves AN, BN, CN, and DN respectively.

At that point in time, electrons crossing the channel of FET A acquire enough energy to effect impact ionization, which creates free electron hole pairs in the p-well 33 of FIG. 3. The holes, then, drift to the $V_{SS}$ 39 of FIG. 3, through resistance 38. In other words, a current flows from p-well 33 into $V_{SS}$ 39 (typically a metal conduit) though resistance 38. As a result, the voltage of the p-well 33 is increased. As a result of the p-well being elevated to a higher potential value, the characteristic i-v curve shifts according to FIG. 2B, to a new i-v curve that does not exhibit a knee. This shift can also be seen in FIG. 4. The characteristic curves are no longer the "normal" curves AN, BN, CN, DN, but are the "zapped" curves AZ, BZ, CZ, DZ, only for the duration of the ESD. Therefore, the ultimate operating points of the FETs shift from AN2.5, BN2.5, CN2.5, DN2.5 to AZ3, BZ3, CZ3, and DZ3 respectively.

Therefore, lock-on of one finger only is avoided. All FETs are allowed to contribute substantially equally in channeling the positive ESD current from the pad to $V_{SS}$ 39, which is typically a metal conduit. Consequently, the current at any one of the FETs will never have to exceed the threshold value T, which would result in the FET getting burned out.

For the effect to work, the value of the resistance should exceed the minimum resistance $R_{MIN}$ given by Equation (1):

$$R_{MIN} = \frac{\beta V_{WELL}}{WI_{DMAX}} \quad (1)$$

where:

$\beta$ is the current gain for the lateral bipolar device formed by nMOS device in snapbook mode, $V_{WELL}$ is the p-well voltage at which the trigger voltage equals the holding voltage, W is the width of one finger (all fingers are presumed to have the same width) (where width is the channel width and length is the gate length measured from one side of the channel (e.g. source) to the other side of the channel (e.g. drain), $I_{DMAX}$ is the maximum safe drain current per width in snap back mode. The value of the resistor must be large enough to ensure that all fingers of the nMOS device trigger before the first finger (device) which "snaps back" destroys itself.

The apparatus described can be used for ESD protection of pads for input, output and I/O pins. Additionally, implementing the invention does not add process steps, because it simply utilizes existing steps for fabrication.

Figure 5:
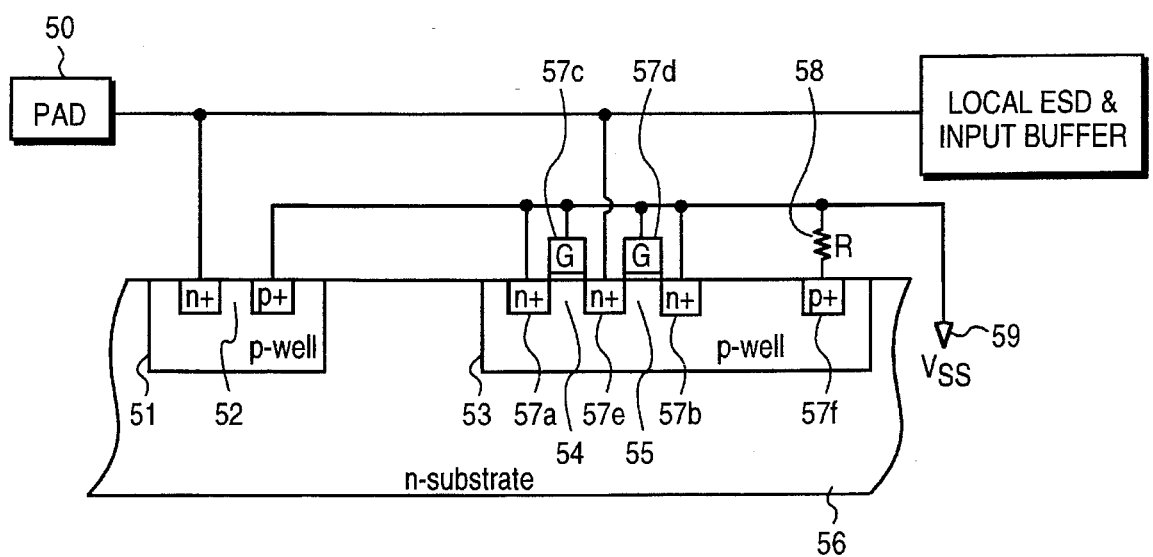
FIG. 5 illustrates a schematic diagram of an apparatus according to the present invention.

An embodiment of the present invention is shown in FIG. 5. The embodiment of FIG. 5 shows a simplified cross section of the ESD apparatus of the invention and is very similar to the embodiment of FIG. 3, except in FIG. 5 only two nMOS FETs are shown in the p-well structure 53 which provides the positive ESD protection and which corresponds to p-well 33 in FIG. 3.

In FIG. 5, an ESD protection structure is interposed between the pad 50 and the $V_{SS}$ 59, which is typically a metal conduit. A diode 52 is contained in a first p-well 51, and comprises the negative ESD protection component of the ESD protection circuit. The diode 52 has been implemented by n+ and p+ diffusion and/or implantation into p-well 51 into the n substrate as shown in FIG. 5. The n+ terminal is electrically connected to the pad 50, and the p+ terminal is electrically connected to $V_{SS}$ 59.

The positive ESD protection structure is contained in p-well 53 which is formed in the n substrate 56 shown in FIG. 5. nMOSFETs 54 and 55 have been implemented by n+ implantation and/or diffusion into p-well 53. The sources 57a and 57b and the gates 57c and 57d are electrically connected to the $V_{SS}$ 59, while the common drain 57e is electrically connected to pad 50.

Additionally, resistance 58 is electrically connected between the p-well 53 and metal conduit of $V_{SS}$ 59. The resistance (e.g. resistor) 58 contacts p-well 53 at a p+ "plug" region 57f formed typically by diffusion and/or implantation of a p type dopant into the p-well 53.

Although shown as a two-finger structure, the embodiment of FIG. 5 can be readily extended to designs with more fingers.

Figure 6:
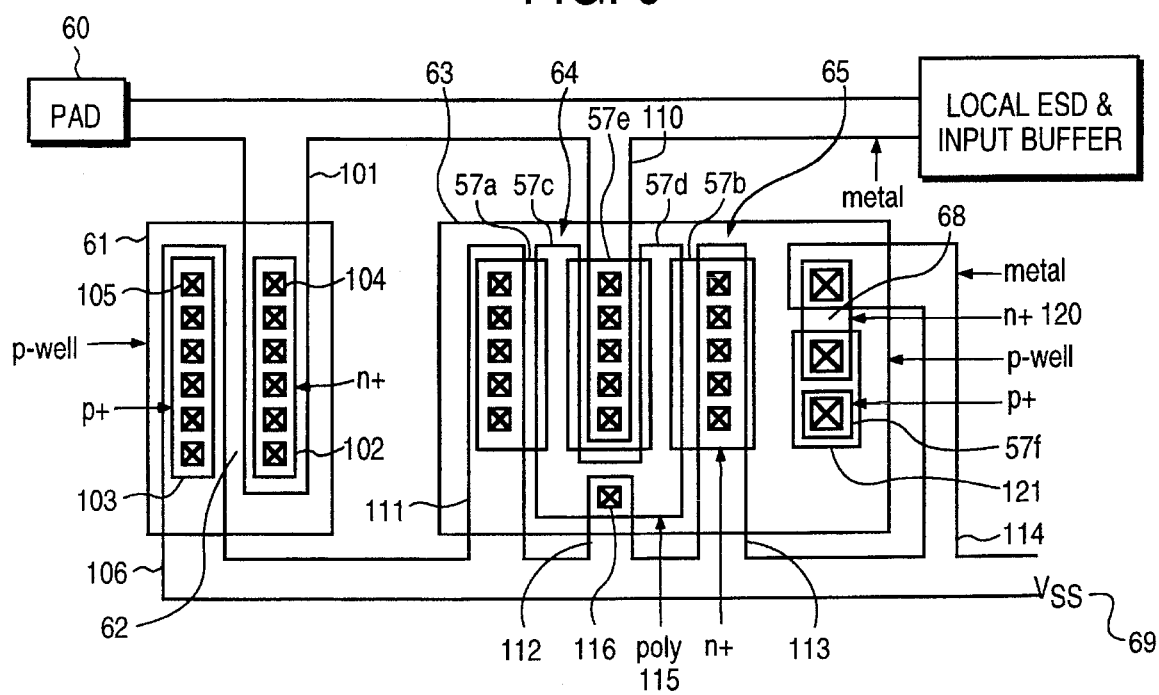
FIG. 6 illustrates a physical layout for implementing the present invention.

In implementing the resistance 58, n+ diffusion may be placed in the p-well. Alternately, any resistive material would be satisfactory, even the p-well itself. A resistor may be formed, as is well known, from an FET. Examples of other implementations are: a polysilicon resistor above the silicon substrate or local interconnects (either polysilicon, a metal, or a silicide) in multiple layers such as multiple polysilicon processing technologies or a p diffusion in an n-well. An embodiment where n+ diffusion in the p-well has been used as resistance 58 is shown in FIG. 6, where the plug region 57f is coupled by a contact to the n+ region in the p-well 53. Otherwise, the embodiment of FIG. 6 is similar to the embodiment of the present invention shown in FIG. 5.

As shown in FIG. 6, a negative ESD protection circuit is contained in p-well 61, and is electrically connected to the pad 60 by the metal line 101 and to the metal conduit of $V_{SS}$ 69. The circuit comprises a diode 62, implemented by p+ and n+ regions, formed by implantations and/or diffusions as is well known in the art. The n+ region 102 in p-well 61 corresponds to the n+ region in p-well 51 of FIG. 5, and the p+ region 103 in p-well 61 corresponds to the p+ region in p-well 51. The squares, each of which contain an "X", represent a contact (electrical) between the metal layer above the substrate (e.g. metal line 101) and the underlying region in the substrate (e.g. metal line 101 is shown connected to n+ region 102 by six such contacts, such as contact 104, and metal line 106 is shown connected to the p+ region 103 by six contacts, such as contact 105).

A positive ESD protection circuit is contained in p-well 63, and is electrically connected to the pad 60 by metal line 110 and the conduit 69 ($V_{SS}$) by metal lines 111, 112, 113 and 114. The circuit comprises two nMOS FETs 64 and 65 that have been implemented by methods well known in the art and correspond to MOSFETs 54 and 55 of FIG. 5. Additionally, the positive ESD protection circuit comprises resistance 68 implemented by a length of n+ region 120 in p-well 63.

The regions 57a, 57b, 57c, 57d and 57e of FIG. 5 have been labelled in FIG. 6 to show their location relative to the other components of the ESD protection circuit. Metal line 111 is connected by contacts to region 57a, and metal line 113 is connected by contacts to region 57b, and both metal lines 111 and 113 are connected to $V_{SS}$ 69 and to the poly-silicon gates 57c and 57d. Metal line 112 (and $V_{SS}$ 69) is connected to the polysilicon gates 57c and 57d by contact 116. Thus n+ regions 57a and 57b and gates 57c and 57d are connected to VSS 69 while n+ region 57e is connected to pad 60.

The resistance 58 of FIG. 5 is shown in FIG. 6 as a n+ diffused and/or implanted region 120 in the p-well 63. This n+ region is coupled by a short metal line 121 to the p+ plug region 57f; thus, metal line 121 makes contact to the p+ plug region 57f and at the other end of line 121 makes a contact to one end of n+ region 120. At the other end of n+ region 120, a metal line 114 is connected by a contact to the n+ region 120, and this line 114 is connected to $V_{SS}$ 69.

Although shown as a two-finger structure, the embodiment of FIG. 6 can be easily extended to designs with more fingers.

The invention has been described in conjunction with the preferred embodiment. It is evident that numerous alternatives, modifications, variations and uses will be apparent to those skilled in the art in light of the foregoing description.

For example, the invention could be alternately implemented as the pull-down nMOS device of an output driver for an output pin/pad or I/O pin/pad. This would be accomplished by connecting the gate of the nMOS FETs in the p-well to a pull-down signal, instead of $V_{SS}$. It will be appreciated that the pull-down signal is a signal from logic within the integrated circuit, which signal is usually provided by an output buffer.

Figure 7:
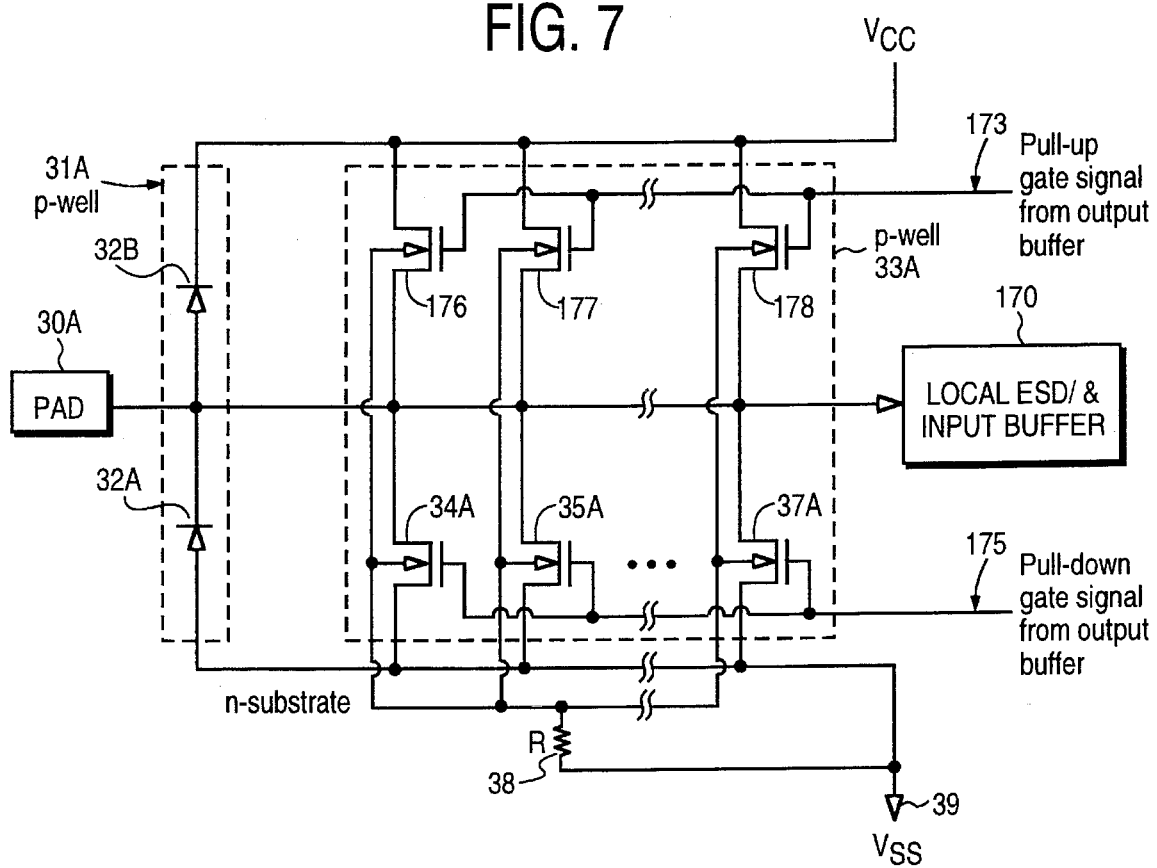
FIG. 7 shows a schematic diagram of an apparatus according to the present invention.

Alternately, the invention could be implemented as an nMOS pull-up ESD protection circuit, interposed between the pad and the power supply conduit, usually denoted as $V_{CC}$. Further, different embodiments can be implemented where ESDs of one polarity are channeled into a first metal voltage conduit, and ESDs of the opposite polarity are channeled into a second metal conduit. FIG. 7 shows an embodiment of the present invention wherein the invention is implemented for an I/O pin/pad to provide both the pull-up nMOS driver device and separately the pull-down nMOS driver device of an output buffer as well as ESD protection. The embodiment of FIG. 7 includes a p-well 31A and a p-well 33A both in the n-substrate in a similar fashion as p-well 31 and p-well 33 of FIG. 3 are in an n-substrate. A resistor 38 of FIG. 7 is coupled between the p-well 33A and $V_{SS}$ in a similar fashion as in the resistor 38 of FIG. 3. The p-well 33A is shown containing at least six nMOS FETs (although only four nMOS FETs would be acceptable), where FETs 34A, 35A and 37A are similar to FETs 34, 35 and 37 of FIG. 3 except that the gates of FETs 34A, 35A and 37A are coupled to receive a pull-down gate signal from, for example, a conventional output buffer circuit. The nMOS FETs 176, 177 and 178 have their gates coupled to receive a pull-up gate signal from, for example, a conventional output buffer circuit which provides a pull-up signal. The nMOS FET 176 has its source/drain current path coupled in series with source/drain current path of FET 34A such that the combined FETs 34A and 176 are coupled in series between $V_{CC}$ and $V_{SS}$. The p-well 31A contains two diodes 32A and 32B which are coupled in series between $V_{CC}$ and $V_{SS}$.

The embodiment of FIG. 7 operates in the following manner. When the pad 30A is being used as an input pad, the local ESD and input buffer circuits 170 receive the normal (non ESD) input signal which is supplied to the pad 30A. In this mode (input) the pull-up and pull-down gate signals are at $V_{SS}$ which is provided by the conventional output buffers. If an ESD event occurs, the diode 32A (in the case of a negative ESD event) or the FETs 34A, 35 and 37A (in the case of a positive ESD) dissipate the charge from an ESD event into the $V_{SS}$ conduit. Also in an ESD event, the diode 32B may dissipate a positive ESD charge between the pad 30A and $V_{CC}$ or the FETs 176, 177 . . . 178 may dissipate a negative ESD charge between the pad 30A and $V_{CC}$. When the pad 30A is being used as an output pad, the conventional output buffer or buffers supply a $V_{SS}$ state to either line 173 or 175 and drive the other line high, depending on whether the output is to be driven high (by the pull-up signal on line 173) or low (by the pull-down signal on line 175). In other words, when pad 30A is used as an output and is to be driven low, then a $V_{SS}$ state is supplied to line 173 (from the output buffer of the pull-up gate signal) and the pull-down gate signal from the buffer of this signal is driven high, which turns on the FETs 34A, 35A . . . 37A, thereby pulling down the pad 30A to $V_{SS}$ (low). In the opposite output situation, the line 175 is placed in a $V_{SS}$ state and line 173 is driven high by the pull-up gate signal from the output buffer of the pull-up gate signal; this causes the FETs 176, 177 . . . 178 to be turned on, thereby pulling up the pad 30A to $V_{CC}$.

The invention may be implemented in a wide array of technologies. However, the invention is of particular value to specific technologies. One such technology is CMOS processing technology with p-wells with Self-Aligned Silicide, alternately known as Salicide. Another such technology is CMOS processing with "triple well" processing technology (which is usually a p-well placed into an n-well which itself is in a p substrate). Another technology to which the invention could be advantageously applied is silicon on insulator technology, where all FETs are isolated from each other.

What is claimed is:

1. A protective circuit adapted for Electrostatic Discharge (ESD) protection of an integrated circuit, the protective circuit electrically connected to a contact pad and to voltage conduits present in the integrated circuit, the protective circuit comprising:

(a) a first ESD protection circuit having a first and a second terminal, the first terminal of the first ESD protection circuit electrically connected to the contact pad, the second terminal of the first ESD protection circuit electrically connected to a first voltage conduit, the first ESD protection circuit adapted for discharging Electrostatic Discharges (ESDs) of a first polarity from the contact pad into the first voltage conduit;

(b) a second ESD protection circuit adapted for discharging ESDs of a second polarity from the contact pad into the first voltage conduit, the second polarity being opposite in sign to the first polarity, the second ESD protection circuit contained in a first p-well that is at a first potential, the second ESD protection circuit having a first and a second terminal, the first terminal of the second ESD protection circuit electrically connected to the contact pad, the second terminal of the second ESD protection circuit electrically connected to the first voltage conduit, the second ESD protection circuit comprising at least a plurality of operative nMOSFET devices, the drains of the operative nMOSFET devices electrically connected to the first terminal of the second ESD protection circuit, the sources and the gates of the operative nMOSFET devices electrically connected to the second terminal of the second ESD protection circuit; and (c) a resistor having a first and a second terminal, the first resistor terminal electrically connected to the first voltage conduit, the second resistor terminal electrically connected to the first p-well.

2. The protective circuit of claim 1, wherein the first ESD protection circuit is contained in a second p-well that is distinct from the first p-well.

3. The protective circuit of claim 1, wherein the resistor is implemented by n+ diffusion in the first p-well.

4. The protective circuit of claim 1, wherein the first voltage conduit is ground.

5. The protective circuit of claim 1, wherein the first ESD protection circuit comprises a diode and wherein each operative nMOSFET device having a holding voltage, a trigger voltage that depends on the potential of the first p-well, a maximum safe drain current in snapback mode and a threshold resistance, the threshold resistance being equal to the product of the current gain for a lateral bipolar transistor formed by the operative nMOSFET device in snapback mode multiplied by the first p-well's voltage at which the trigger voltage of the operative nMOSFET device equals the holding voltage of the operative nMOSFET device divided by the maximum safe drain current in snapback mode of the operative nMOSFET device, and wherein the resistor having a resistance larger than the maximum of the threshold resistances of the operative nMOSFET devices, and wherein an electrical current during an ESD is caused to flow through the resistor thereby causing the first p-well to be elevated to a second potential that is higher than the first potential, thereby lowering the threshold voltage of each operative nMOSFET device.

6. The protective circuit of claim 5, wherein the electrical current has been caused to flow due to impact ionization.

7. A protective circuit adapted for Electrostatic Discharge (ESD) protection of an integrated circuit, the protective circuit electrically connected to a contact pad and to voltage conduits present in the integrated circuit, the protective circuit comprising:

(a) a first ESD protection circuit comprising at least a diode is contained in a second p-well, the diode having a first and a second terminal, the first terminal of the diode electrically connected to the contact pad, the second terminal of the diode electrically connected to a first voltage conduit, the first ESD protection circuit adapted for discharging Electrostatic Discharges (ESDs) of a first polarity from the contact pad into the first voltage conduit;

(b) a second ESD protection circuit adapted for discharging ESDs of a second polarity from the contact pad into the first voltage conduit, the second polarity being opposite in sign to the first polarity, the second ESD protection circuit contained in a first p-well that is distinct from the second p-well, the first p-well being at a first potential, the second ESD protection circuit having a first and a second terminal, the first terminal of the second ESD protection circuit electrically connected to the contact pad, the second terminal of the second ESD protection circuit electrically connected to the first voltage conduit, the second ESD protection circuit comprising at least a plurality of operative nMOSFET devices, the drains of the operative nMOSFET devices electrically connected to the first terminal of the second ESD protection circuit, the drains and the gates of the operative nMOSFET devices electrically connected to the second terminal of the second ESD protection circuit voltage; and (c) a resistor having a first and a second terminal, the first resistor terminal electrically connected to the first voltage conduit, the second resistor terminal electrically connected to the first p-well, the resistor having a resistance larger than the maximum of the threshold resistances of the operative nMOSFET devices, wherein an electrical current is caused to flow through the resistor thereby causing the first p-well to be elevated to a second potential that is higher than the first potential, thereby lowering the threshold voltage of each operative nMOSFET device.

8. The protective circuit of claim 7, wherein the resistor is implemented by n+ diffusion in the first p-well.

9. The protective circuit of claim 7, wherein the first voltage conduit is $V_{SS}$.

10. The protective circuit of claim 7, wherein the electrical current has been caused to flow due to impact ionization and wherein each operative nMOSFET device having a holding voltage, a trigger voltage that depends on the potential of the first p-well, a maximum safe drain current in snapback mode and a threshold resistance, the threshold resistance being equal to the product of the current gain for a lateral bipolar transistor formed by the operative nMOSFET device in snapback mode multiplied by the first p-well's voltage at which the trigger voltage of the operative nMOSFET device equals the holding voltage of the operative nMOSFET device divided by the maximum safe drain current in snapback mode of the operative nMOSFET device.

11. A protective circuit adapted for electrostatic discharge protection of an integrated circuit, said circuit coupled to a contact pad and to a voltage conduit in the integrated circuit, said protective circuit comprising:

a p-well region in a substrate of said integrated circuit;

a plurality of n channel MOS field effect transistors disposed in said p-well region, each of said transistors having a gate, a source and a drain, each source being coupled to said voltage conduit and each drain being coupled to said contact pad;

a resistance means coupled to said p-well region and to said voltage conduit, said resistance means being coupled in series between said p-well region and said voltage conduit.

12. A protective circuit as in claim 11 wherein said resistance means is one of a resistor and an MOS field effect transistor and wherein each gate is coupled to said voltage conduit.

13. A protective circuit as in claim 11 further comprising:

a further p-well region in said substrate being distinct from said p-well region;

a diode disposed in said further p-well region, said diode being coupled in series between said contact pad and said voltage conduit.

14. A protective circuit as in claim 13 wherein said voltage conduit is ground.

15. A protective circuit as in claim 11 wherein said p-well region is disposed in an n-well and wherein said n-well is disposed in said substrate which is of p conductivity type.

16. A protective circuit adapted for electrostatic discharge protection of an integrated circuit, said circuit coupled to a contact pad and to a second voltage conduit in the integrated circuit, said protective circuit comprising:

a p-well region in a substrate of said integrated circuit;

a plurality of n channel MOS field effect transistors disposed in said p-well region, each of said transistors having a source and a drain, each source being coupled to said contact pad, and each drain being coupled to said second voltage conduit;

a resistance means coupled to said p-well region and to a first voltage conduit, said resistance means being coupled in series between said p-well region and said first voltage conduit.

17. A protective circuit as in claim 16 wherein said resistance means is one of a resistor and an MOS field effect transistor and wherein each gate is coupled to receive a pull-up gate signal.

18. A protective circuit as in claim 17 further comprising:

a further p-well region in said substrate being distinct from said p-well region;

a diode disposed in said further p-well region, said diode being coupled in series between said contact pad and said second voltage conduit.

19. A protective circuit as in claim 18 wherein said first voltage conduit is $V_{SS}$ and said second voltage conduit is $V_{CC}$.

* * * * *